(12) United States Patent
Ata et al.

(10) Patent No.: US 8,692,340 B1
(45) Date of Patent: Apr. 8, 2014

(54) MEMS ACOUSTIC SENSOR WITH INTEGRATED BACK CAVITY

(71) Applicant: InvenSense, Inc., Sunnyvale, CA (US)

(72) Inventors: Erhan Polatkan Ata, Santa Clara, CA (US); Martin Lim, San Mateo, CA (US); Xiang Li, Mountain View, CA (US); Stephen Lloyd, Los Altos, CA (US); Michael Julian Daneman, Campbell, CA (US)

(73) Assignee: Invensense, Inc., San Jose, CA (US)

( * ) Notice: Subject to any disclaimer, the term of this patent is extended or adjusted under 35 U.S.C. 154(b) by 0 days.

(21) Appl. No.: 13/800,061

(22) Filed: Mar. 13, 2013

(51) Int. Cl.
*H01L 29/82* (2006.01)

(52) U.S. Cl.
USPC ........... 257/416; 257/415; 257/417; 257/418; 257/419; 257/420

(58) Field of Classification Search
USPC .................. 257/415, 416, 417, 418, 419, 420
See application file for complete search history.

(56) References Cited

U.S. PATENT DOCUMENTS

| | | | |
|---|---|---|---|
| 4,495,385 | A | 1/1985 | Roberts et al. |
| 4,524,247 | A | 6/1985 | Lindenberger et al. |
| 4,533,795 | A | 8/1985 | Baumhauer, Jr. et al. |
| 4,558,184 | A | 12/1985 | Busch-Vishniac et al. |
| 6,136,630 | A | 10/2000 | Weigold et al. |
| 6,429,458 | B1 | 8/2002 | Weigold et al. |
| 7,434,305 | B2 | 10/2008 | Minervini |
| 7,449,356 | B2 | 11/2008 | Weigold |
| 7,795,063 | B2 | 9/2010 | Hsieh et al. |
| 7,951,636 | B2 | 5/2011 | Lee et al. |
| 8,045,734 | B2 | 10/2011 | Zhe et al. |
| 2007/0047746 | A1 | 3/2007 | Weigold et al. |
| 2007/0064968 | A1 | 3/2007 | Weigold |
| 2007/0082421 | A1 | 4/2007 | Minervini |
| 2007/0087466 | A1 | 4/2007 | Weigold et al. |
| 2007/0092983 | A1 | 4/2007 | Weigold |
| 2007/0165888 | A1 | 7/2007 | Weigold |
| 2008/0175418 | A1 | 7/2008 | Zhang et al. |
| 2009/0029501 | A1 | 1/2009 | Weigold |
| 2009/0166772 | A1 | 7/2009 | Hsieh et al. |
| 2009/0179233 | A1 | 7/2009 | Lee et al. |

(Continued)

FOREIGN PATENT DOCUMENTS

| | | |
|---|---|---|
| WO | WO 03/055271 | 7/2003 |
| WO | WO 2010/119415 | 10/2010 |

OTHER PUBLICATIONS

Christina Leinenbach, et al., "A New Capacitive Type MEMS Microphone," IEEE, 2010, pp. 659-662.

(Continued)

*Primary Examiner* — Samuel Gebremariam
(74) *Attorney, Agent, or Firm* — Sawyer Law Group, P.C.

(57) ABSTRACT

A MEMS device is disclosed. The MEMS device comprises a first plate with a first surface and a second surface; and an anchor attached to a first substrate. The MEMS device further includes a second plate with a third surface and a fourth surface attached to the first plate. A linkage connects the anchor to the first plate, wherein the first plate and second plate are displaced in the presence of an acoustic pressure differential between the first and second surfaces of the first plate. The first plate, second plate, linkage, and anchor are all contained in an enclosure formed by the first substrate and a second substrate, wherein one of the first and second substrates contains a through opening to expose the first surface of the first plate to the environment.

23 Claims, 11 Drawing Sheets

(56) References Cited

U.S. PATENT DOCUMENTS

| | | |
|---|---|---|
| 2009/0278217 A1 | 11/2009 | Laming et al. |
| 2009/0285419 A1 | 11/2009 | Shih et al. |
| 2009/0309171 A1 | 12/2009 | Schrank |
| 2009/0316916 A1 | 12/2009 | Haila et al. |
| 2010/0052082 A1 | 3/2010 | Lee et al. |
| 2010/0067728 A1 | 3/2010 | Chen |
| 2010/0092020 A1 | 4/2010 | Ryan et al. |
| 2010/0158279 A1 | 6/2010 | Conti et al. |
| 2010/0158280 A1 | 6/2010 | Coronato et al. |
| 2010/0277229 A1 | 11/2010 | Lee et al. |
| 2010/0330722 A1 | 12/2010 | Hsieh et al. |
| 2011/0104844 A1 | 5/2011 | Hsieh et al. |
| 2011/0189804 A1 | 8/2011 | Huang et al. |
| 2011/0210409 A1 | 9/2011 | Minervini |
| 2011/0280419 A1 | 11/2011 | Kasai |
| 2011/0311081 A1 | 12/2011 | Kim |

OTHER PUBLICATIONS

Rafael Nadal-Guardia, et al., "AC Transfer Function of Electrostatic Capacitive Sensors Bases on the 1-D Equivalent Model: Application to Silicon Microphones," Journal of Microelectromechanical Systems, vol. 12, No. 6, Dec. 2003, pp. 972-978.

Marc Fuldner, et al., "Analytical Analysis and Finite Element Simulation of Advanced Membranes for Silicon Microphones," IEEE Sensors Journal, vol. 5, No. 5, Oct. 2005, pp. 857-863.

Marc Fuldner, et al., "Challenges of High SNR (Signal-To-Noise) Silicon Micromachined Microphones," 19th International Congress on Acoustics, Madrid, Sep. 2-7, 2007, pp. 1-6.

Rafael Nadal-Guardia, et al., "Constant Charge Operation of Capacitor Sensors Based on Switched-Current Circuits," IEEE Sensors Journal, vol. 3, No. 6, Dec. 2003, pp. 835-842.

Gregor Feiertag, et al., "Flip chip MEMS microphone package with large acoustic reference volume," Proc. Eurosensors XXIV, Sep. 5-8, 2010, Linz, Austria, Procedia Engineering, Elsevier Ltd., pp. 355-358.

M. Brauer, et al., "Improved signal-to-noise ratio of silicon microphones by a high-impedance resistor," Institute of Physics Publishing, Journal of Micromechanics and Microengineering, Aug. 2004, pp. S86-S89.

Matthias Winter, et al., "Influence of a chip scale package on the frequency response of a MEMS microphone," Microsyst Technol, Springer, published online Dec. 25, 2009, 7 pages.

J. Bernstein, "MEMS Microphones at Draper MEMS Air Acoustics Research the Charles Stark Draper Laboratory," Aug. 1999, pp. 1-8.

Timo Veijola, "Nonlinear Circuit Simulation of MEMS Components: Controlled Current Source Approach," Proceedings of ECCTD'01, Espoo, Finland, Aug. 28-31, 2001, vol. 3, pp. 377-380.

M. Brauer, et al., "Silicon microphone based on surface and bulk micromachining," Institute of Physics Publishing, Journal of Micromechanics and Microengineering, 2001, pp. 319-322.

Alfons Dehe, "Silicon microphone development and application," Sensors and Actuators, 2006, Elsevier, pp. 283-287.

Bert Zinserling, "Silicon-based MEMS Microphone for Automotive Applications," MicroNano News, Feb. 2007, pp. 8-11.

Takashi Kasai, et al., "Small Silicon Condenser Microphone Improved With a Backchamber With Concave Lateral Sides," Transducers & Eurosensors '07, The 14th International Conference on Solid-State Sensors, Actuators and Microsystems, Lyon, France, Jun. 10-14, 2007, pp. 2613-2616.

MEMS ACOUSTIC SENSOR WITH INTEGRATED BACK CAVITY

FIELD OF THE INVENTION

The present invention relates to generally to MEMS devices, and more particularly, to a MEMS microphone.

BACKGROUND

Most commercially available MEMS microphones or silicon microphones are formed by two chips, an application specific integrated circuit (ASIC) chip and a MEMS chip attached to a substrate. These chips are generally enclosed by a conductive cover or lid. An acoustic input can be provided from an opening on a top surface of the microphone or from an opening on the substrate. Typically, in commercial applications where the acoustic input is from the top, an acoustic back cavity is formed mainly by a volume under the MEMS chip and the substrate. By contrast, in commercial applications where the acoustic input is from the bottom, the acoustic cavity is typically formed by the volume enclosed by the substrate and the cover.

It is desirable to provide improvements to MEMS microphones which allow them to be more easily manufactured at a lower cost. The improvement to the MEMS microphone must be easily implemented, cost effective and adaptable to existing manufacturing processes.

The present invention addresses such a need.

SUMMARY OF THE INVENTION

A MEMS device is disclosed. The MEMS device comprises a first plate with a first surface and a second surface; and an anchor attached to a first substrate. The MEMS device further includes a second plate with a third surface and a fourth surface attached to the first plate. A linkage connects the anchor to the first plate, wherein the first plate and second plate are displaced in the presence of an acoustic pressure differential between the first and second surfaces of the first plate. The first plate, second plate, linkage, and anchor are all situated in an enclosure formed by the first substrate and a second substrate, wherein one of the first and second substrates contains a through opening to expose the first surface of the first plate to the environment.

BRIEF DESCRIPTION OF THE DRAWINGS

The accompanying figures illustrate several embodiments of the invention and, together with the description, serve to explain the principles of the invention. One of ordinary skill in the art readily recognizes that the particular embodiments illustrated in the figures are merely exemplary, and are not intended to limit the scope of the present invention.

DETAILED DESCRIPTION

Figure 1A:
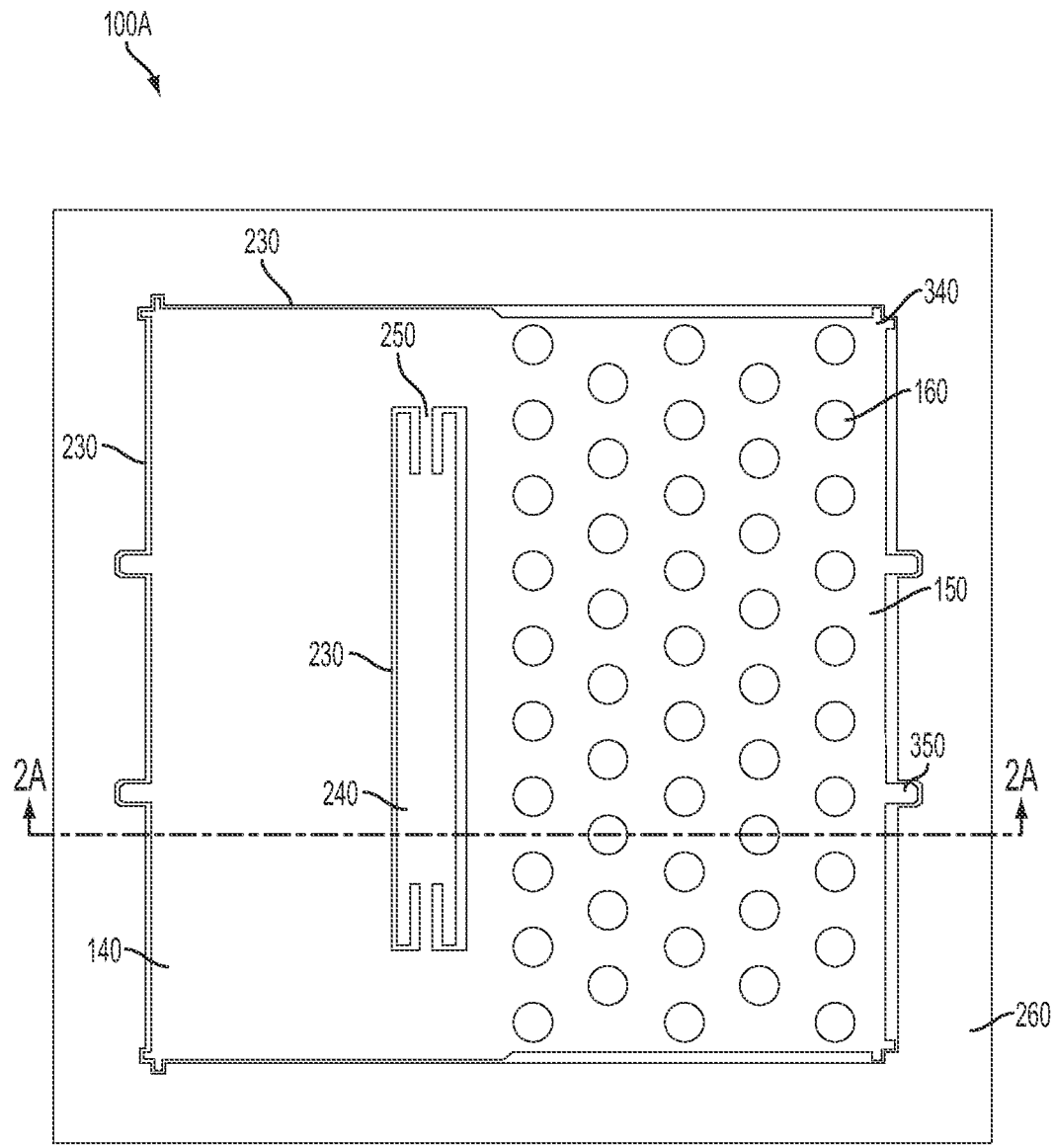
FIGS. 1A and 1B show different embodiments of the top view of the device layer of a torsional microphone.

The present invention relates generally to MEMS devices, and more particularly, to a MEMS acoustic sensor such as a microphone. The following description is presented to enable one of ordinary skill in the art to make and use the invention and is provided in the context of a patent application and its requirements. Various modifications to the described embodiments and the generic principles and features described herein will be readily apparent to those skilled in the art. Thus, the present invention is not intended to be limited to the embodiments shown but is to be accorded the widest scope consistent with the principles and features described herein.

In the described embodiments Micro-Electro-Mechanical Systems (MEMS) refers to a class of structures or devices fabricated using semiconductor-like processes and exhibiting mechanical characteristics such as the ability to move or deform. MEMS devices often, but not always, interact with electrical signals. MEMS devices include but are not limited to gyroscopes, accelerometers, magnetometers, pressure sensors, microphones, and radio-frequency components. Silicon wafers containing MEMS structures are referred to as MEMS wafers.

In the described embodiments, the MEMS device may refer to a semiconductor device implemented as a micro-electro-mechanical system. The MEMS structure may refer to any feature that may be part of a larger MEMS device. The semiconductor layer with the mechanically active MEMS structure is referred to as the device layer. An engineered silicon-on-insulator (ESOI) wafer may refer to a SOI wafer with cavities beneath the silicon device layer or substrate. A handle wafer typically refers to a thicker substrate used as a carrier for the thinner silicon device substrate in a silicon-on-insulator wafer. A handle substrate and a handle wafer can be interchanged.

In the described embodiments, a cavity may refer to an opening or recession in a substrate wafer and an enclosure may refer to a fully enclosed space. A post may be a vertical structure in the cavity of the MEMS device for mechanical support. A standoff is a vertical structure providing electrical contact.

In the described embodiments, a back cavity may refer to a partially enclosed cavity equalized to ambient pressure via Pressure Equalization Channels (PEC). In some embodiments, a back cavity is also referred to as a back chamber. A back cavity formed within the CMOS-MEMS device can be referred to as an integrated back cavity. Pressure equalization channels, also referred to as venting or leakage channels/paths, are acoustic channels for low frequency or static pressure equalization of a back cavity to ambient pressure.

In the described embodiments, a rigid structure within a MEMS device that moves when subject to force may be referred to as a plate. Although rigid plates are preferred for the described embodiments, semi rigid plates or deformable membranes could replace rigid plates. Plates may comprise of silicon, silicon containing materials (e.g. poly-silicon, silicon oxide, silicon nitride), metals and materials that are used in semiconductor processes (e.g. aluminum nitride, germanium). A back plate may be a solid or perforated plate comprising at least one electrode. The electrode can be comprised of semiconductor process compatible conductive materials (e.g. poly-silicon, silicon, aluminum, copper, nickel, titanium, chromium, gold). The electrodes may have insulating films on one or more surfaces.

In the described embodiments, perforations refer to acoustic openings for reducing air damping in moving plates. An acoustic port may be an opening for sensing the acoustic pressure. An acoustic barrier may be a structure that prevents acoustic pressure from reaching certain portions of the device. Linkage is a structure that provides electrical conductivity and compliant attachment to a substrate through an anchor. Extended acoustic gap can be created by step etching of the post and creating a partial post overlap over the PEC. In-plane bump stops limit range of movement in the plane of the plate if the plates move more than desired (e.g. under a mechanical shock). Similarly rotational bump stop are extensions of the plate to limit the displacement normal to the plane due to out-of-plane rotation.

In the described embodiments, structures (plates) of MEMS device and electrodes formed on CMOS substrate form sensor capacitors. Sensor capacitors are electrically biased for detection of change of capacitance due to acoustic pressure.

To describe the features of the present invention in more detail, refer now to the following description in conjunction with the accompanying figures.

Figure 1B:
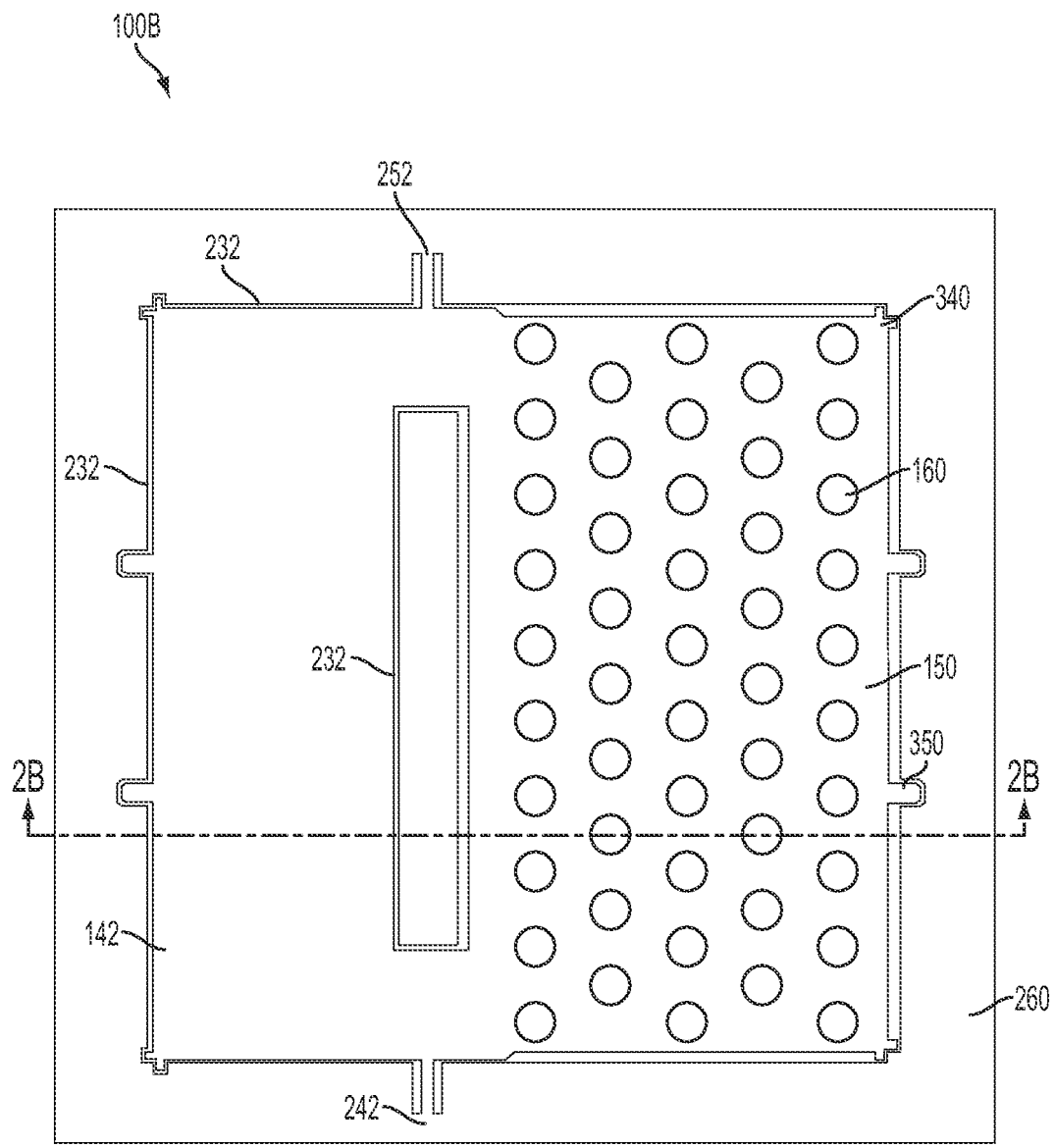

FIGS. 1A and 1B show different embodiments of top views of device layers 100A and 100B of torsional microphone. FIGS. 1A and 1B illustrates a first plate 140, 142 that senses acoustic pressure on its first surface, and a second plate 150 with perforations 160 and a linkage 250, 252 attached to an anchor 240, 242. In an embodiment the first plate 140, 142 and second plate 150 are rigid. The difference between FIGS. 1A and 1B are the locations of linkages 250, 252. A different embodiment may include combination of linkages 250 and 252 resulting in four linkages, adding a central cutout portion to FIGS. 1A and 1B. The first plate 140, 142 is partially surrounded by a pressure equalization channel (PEC) 230, 232, and the device layer 100A, 100B is surrounded by a seal 260 to ensure that the only acoustical input to the device will be via an acoustic port 190 (in FIGS. 2A and 2B.

When a force is applied (acoustic pressure variation) on the first surface of first plate 140, 142, the first plate 140, 142 is rotationally displaced around an axis passing through linkages 250, 252, hence the second plate 150 is displaced in an opposite direction (rotational displacement around the same axis). The linkages 250, 252 form torsional restoring forces acting against movement and will bring the plates to their initial position once externally applied acoustic force is zero. Undesired in plane movements can be limited by introducing in plane bump stops 340 at locations where undesired movement/rotation has a high amplitude, e.g. furthest away from linkages 250, 252. The in plane bump stops 340 can be defined and manufactured on the second plate 150 or the device layer 100A, 100B or the first plate 140, 142 or any combination of these.

In an embodiment, protruding tabs that form rotational bump stops 350 are provided to limit the rotation of the first 140,142 and second plates 150. By proper design the rotational bump stops 350 may eliminate need for reduction or turning off the potential difference between first and second plates 140, 142 and 150, and the electrode 170 shown in FIGS. 2A and 2B for recovery from a tip-in or out of range condition.

Figure 2A:
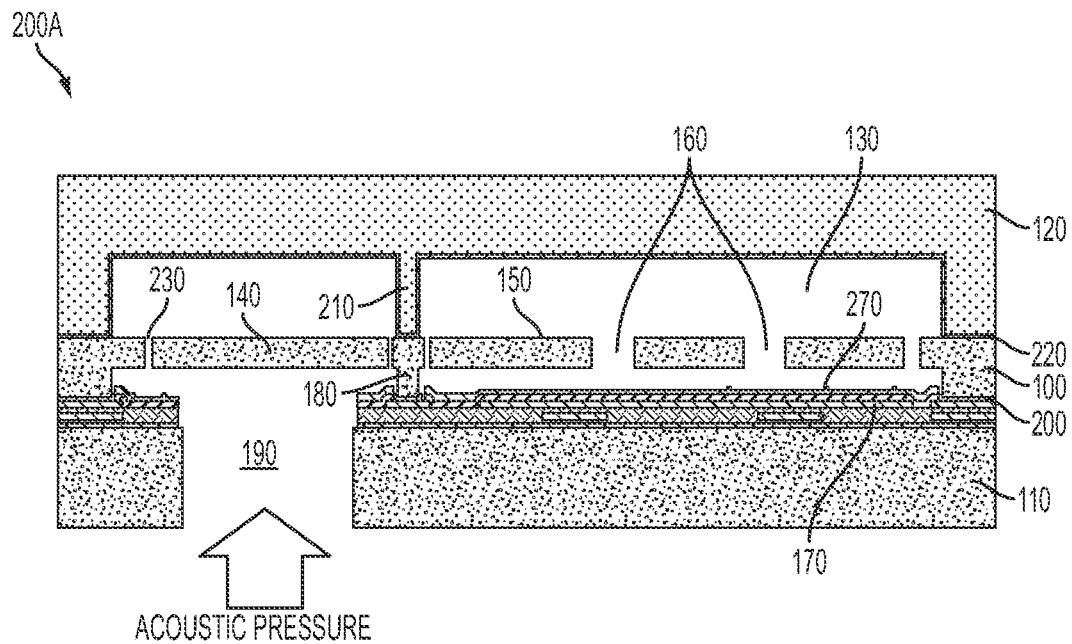
FIG. 2A shows the cross section of the torsional microphone with integrated back cavity along 2A-2A in FIG. 1A.
Figure 2B:
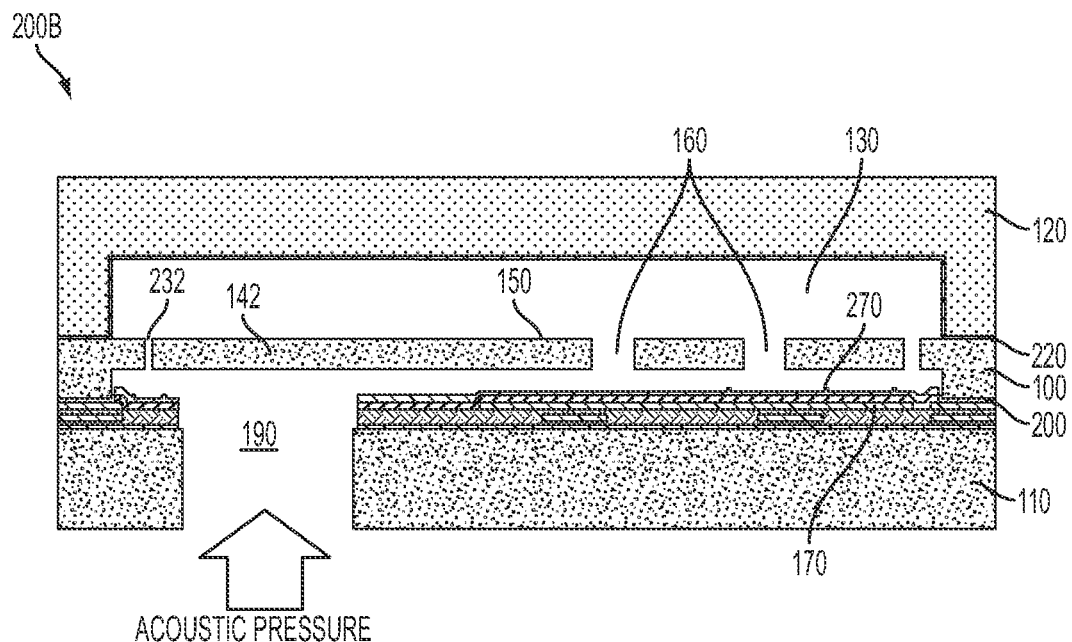
FIG. 2B shows the cross section of the torsional microphone with integrated back cavity along 2B-2B in FIG. 1B.

FIGS. 2A and 2B show the cross section of the torsional microphone 200A and 200B with integrated back cavity 130 along 2A-2A and 2B-2B in FIGS. 1A and B respectively. In an embodiment, integrated back cavity 130 is formed by a fusion bond 220 between the second substrate 120 and the device layer 100A and 100B which is further bonded to the first substrate 110 by conductive alloy (eutectic) bond 200 by processes as described in a commonly owned U.S. Pat. No. 7,442,570, entitled, "Method of Fabrication of a Al/Ge Bonding in a Wafer Packing Environment and a Product Produced Therefrom", which is incorporated herein by reference.

Static pressure in the back cavity 130 is equalized by ambient pressure via air flow through the PEC 230 and 232. Ideally, PEC 230 and 232, provide high resistance to air flow in the frequency range of interest (e.g. 100 Hz and above), and low resistance at lower frequencies down to static pressure changes. Linkages 250 are attached to standoffs 180 both mechanically and electrically. The standoffs 180 in an embodiment are lithographically defined protruding members of device layer that are mechanically and electrically connected to top conductive layers of the first substrate 110 via alloy or eutectic bonding. The device layer 100A and 100B in an embodiment is lithographically patterned to form the first plate 140, a second plate 150, with perforations 160, PEC 230,232 and an acoustic seal 260, around the active device.

The second plate 150 with perforations 160 forms a first electrode and is electrically connected to an integrated circuit (IC) manufactured on the first substrate 110, while a second electrode 170 is disposed on the first substrate 110. Second electrode 170 is aligned with the first electrode or second plate 150. A first surface of second plate 150 and the second electrode 170 form a variable capacitor whose value changes due to pressure being applied on a first surface of first plate 140.142. In an embodiment, additional material such as silicon nitride or silicon oxide is deposited on the second electrode 170. The additional material can be lithographically patterned to form bump stops 270 to reduce stiction force by reducing the contact area in the undesired event that first and/or second plate 140,142 and 150 come into contact with first substrate 110.

Figure 3A:
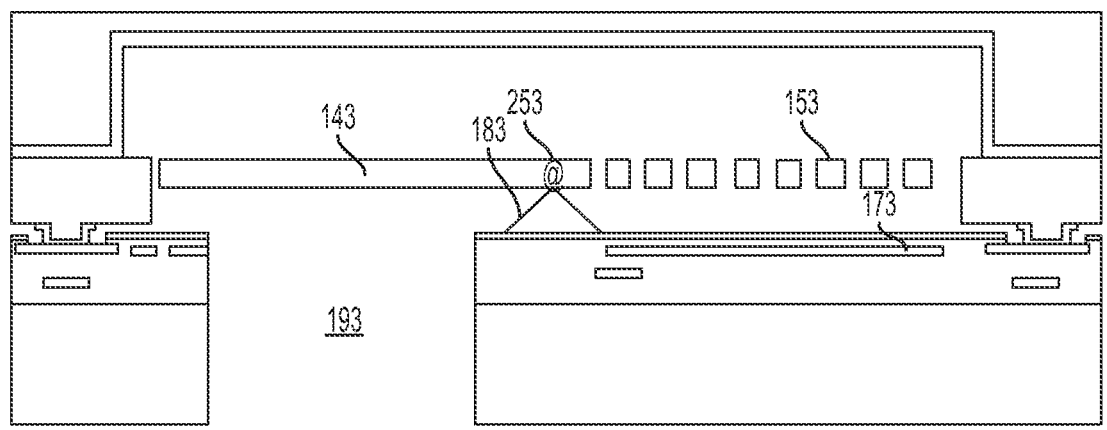
FIGS. 3A and 3B show the operation of the torsional microphone using a symbolic representation for the linkage with torsional compliance.
Figure 3B:
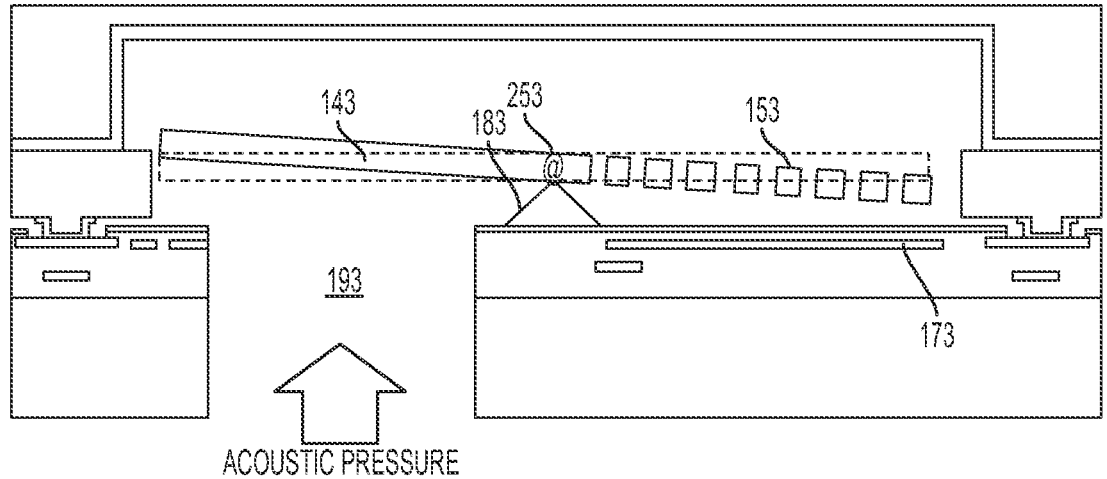

FIGS. 3A and 3B illustrate the conceptual design describing the operation of the torsional microphone of FIG. 2A or 2B with a symbolic anchor 183, and a symbolic torsional linkage, 253.

Referring now to FIG. 3A, the acoustic port 193 is a channel in the first substrate 110 that allows acoustic pressure to reach the first surface of the first plate 143. Under an applied acoustic pressure, the first plate 143 rotates slightly either clockwise or counter-clockwise depending on polarity of acoustic pressure. In FIG. 3B, the case where the first plate 143 rotates in a clockwise direction around a rotation axis that coincides with linkage like structure 253 is depicted.

Rotational movement coupled to the perforated second plate 153 results in a reduced gap between first surface of the second plate 153 and a second electrode 173, hence the capacitance defined by these two surfaces increases. An IC manufactured on the first substrate 110 is electrically connected to both the second plate 153 and second electrode 173 detects the change in capacitance proportional to the acoustic pressure.

Figure 4:
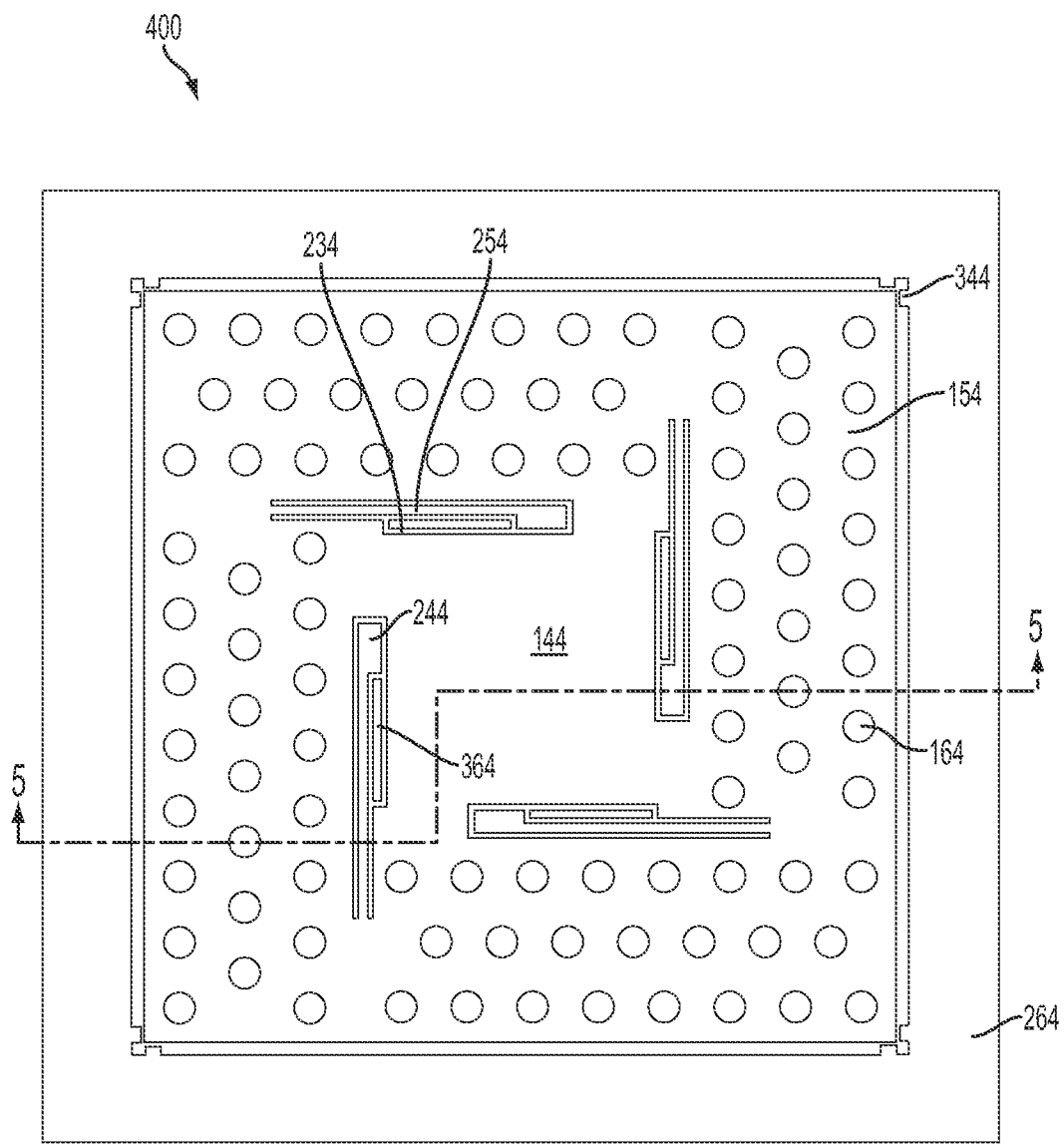
FIG. 4 shows an embodiment of the top view of a device layer of a piston microphone.

FIG. 4 shows a top view of device layer 400 of a piston microphone with rigid first plate 144 that senses acoustic pressure on its first surface, a rigid second plate 154 with perforations 164, and linkages 254 attached to an anchor 244. The number of linkages 254 shown in the device is four, but the number of linkages could be any number and that would be within the spirit and scope of the present invention. Undesired in plane movements can be limited by introducing in plane bump stops 344 at locations where undesired movement/rotation has a high amplitude, e.g., furthest away from the linkages 254. The in plane bump stops 344 can be defined on the second plate 154 or the device layer 104 or the first plate 144, or any combination thereof.

Figure 5:
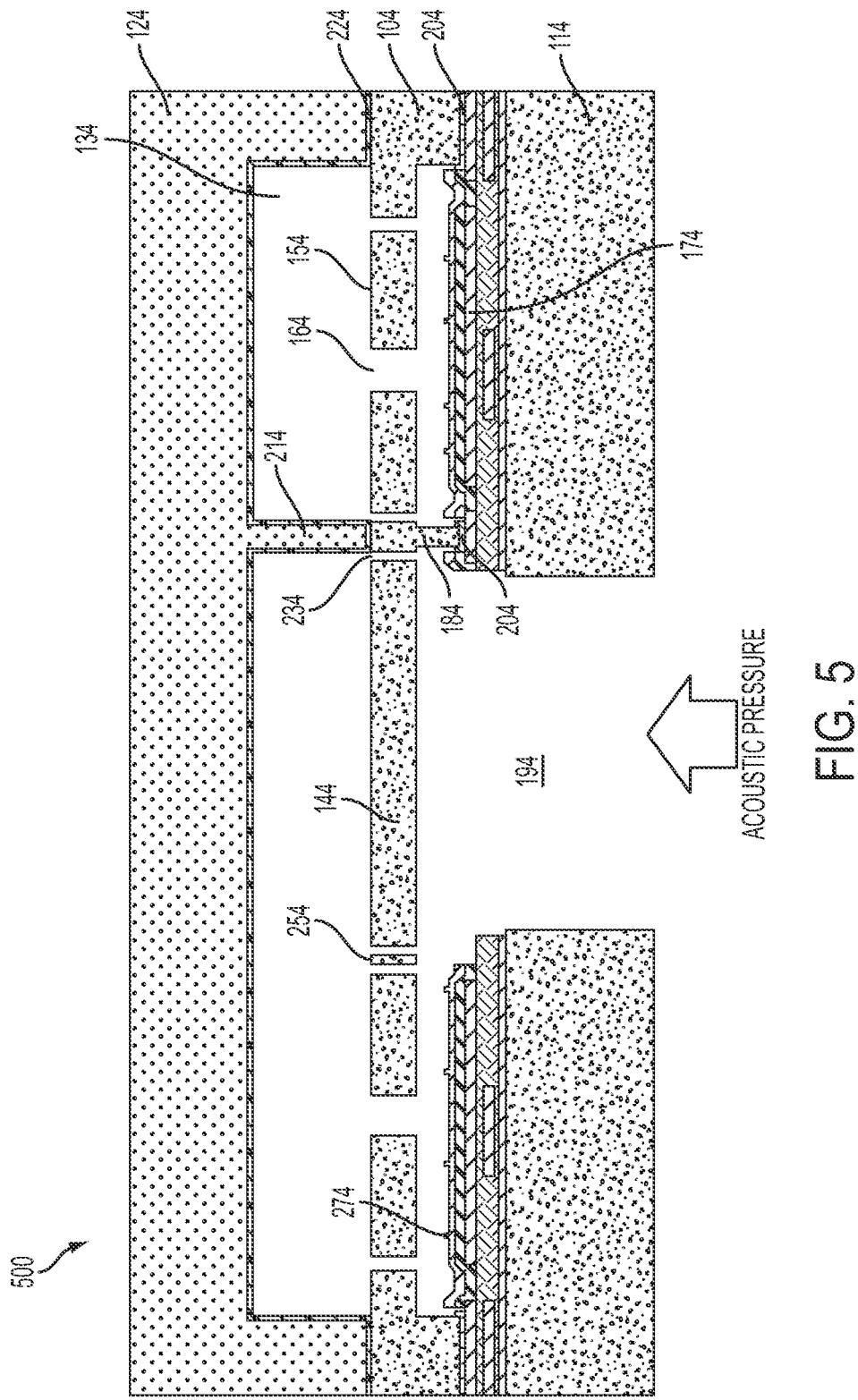
FIG. 5 shows the cross section of the piston microphone with integrated back cavity along 5-5 in FIG. 4.

FIG. 5 shows the cross section of the piston microphone 500, with integrated back cavity 134 along 5-5 in FIG. 4. In an embodiment, the device layer 104 is device layer 400 in FIG. 4. The integrated back cavity 134 is formed by a fusion (oxide) bond 224 between a second substrate 124 and the device layer 104 which further is bonded to the first substrate 114 by a conductive alloy (eutectic) bond 204 by processes as described in a commonly owned U.S. Pat. No. 7,442,570, entitled, "Method of Fabrication of a Al/Ge Bonding in a Wafer Packing Environment and a Product Produced Therefrom", which is incorporated herein by reference. Static pressure in the back cavity 134 is equalized by ambient pressure via air flow through the PEC 234. Linkages 254 are attached to the standoffs 184 both mechanically and electrically.

Acoustic barriers 364 may be introduced wherever suitable for required low frequency response enhancement.

The first plate 144 is partially surrounded by a PEC 234. The entire structure is surrounded by a seal 264 to ensure that the only acoustical input to a cavity 134 is via acoustic port 194. When an acoustic force is applied on the first surface of first plate 144, the first plate 144 is displaced up or down depending on polarity of pressure. The second plate 154 is displaced in the same direction as the first plate 144. Both plates 144 and 154 are attached to the anchors 244 via the linkages 254, which apply an opposite restoring force to first and second plates 144 and 154. When the acoustic force is reduced to zero, the restoring force brings first and second plates 144 and 154 to their original operating position.

The standoffs 184 are lithographically defined protruding members of the device layer that are mechanically and electrically connected to the first substrate 114 via alloy (eutectic) bonding to a top metal layer of the first substrate 114. The device layer 104 is lithographically patterned to form the first plate 144, second plate 154 and plate with perforations 164, the PEC 234 and an acoustic seal around the active device. The second plate 154 forms a first electrode and is electrically connected to an integrated circuit (IC) manufactured on the first substrate 114, while a second electrode 174 manufactured on the first substrate 114 is designed to be aligned with first electrode 174. A first (bottom) surface of the second plate 154 and the second electrode 174 forms a variable capacitor whose value depends on the pressure applied on the first surface of the first plate 144. The second electrode 174 in an embodiment is buried under a stack of silicon nitride and silicon dioxide which further can be lithographically patterned to form bump stops 274 to reduce stiction force by reducing contact area in the undesired event that first and/or second plates 144 and 154 come into contact with the first substrate 114.

Figure 6A:
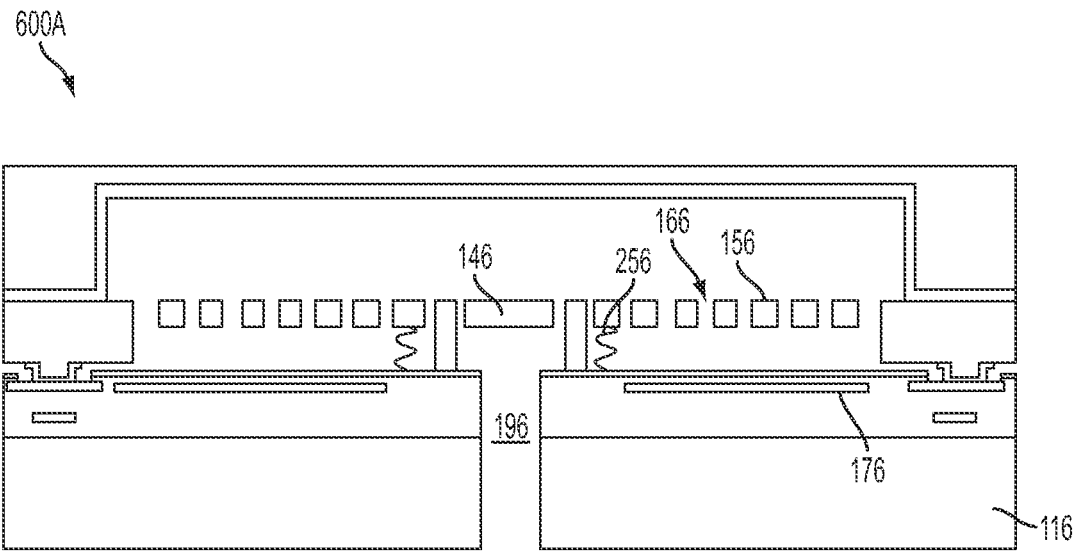
FIGS. 6A and 6B show the operation of a piston microphone using a symbolic representation for the linkage with bending compliance.
Figure 6B:
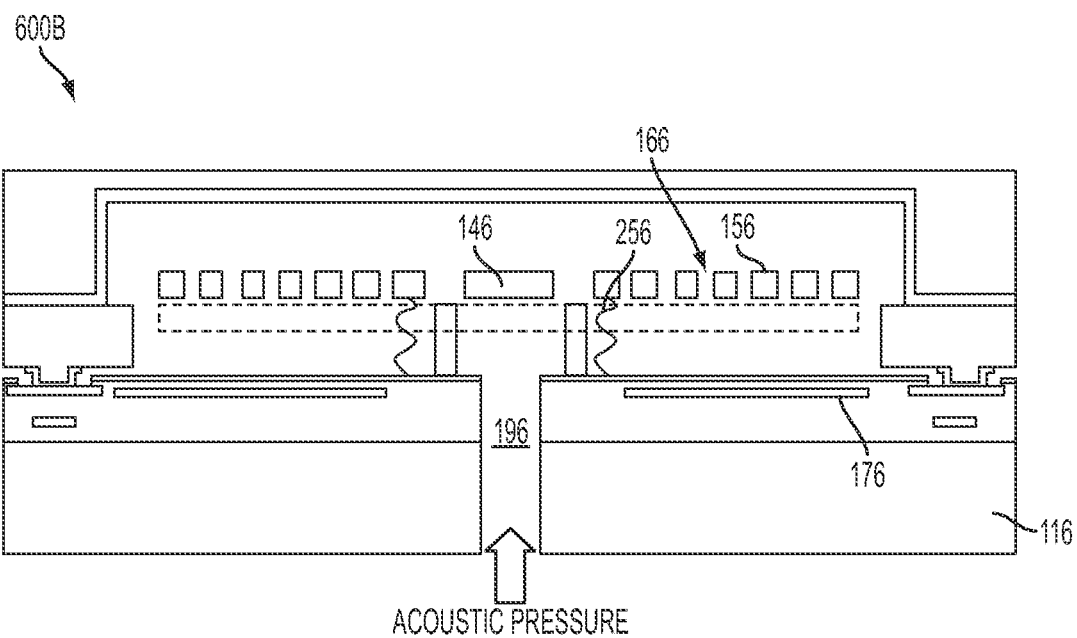

FIGS. 6A and 6B illustrate the conceptual designs showing the operation of a piston microphone of FIG. 5. The linkages 254 in FIG. 5 are now represented by symbolic springs 256 and support the first plate 146, second plate 156 the acoustic port 196 is a channel in a first substrate 116 for acoustic pressure to reach the first surface of the first plate 146. Under an applied acoustic pressure the first plate 146 slightly moves up or down depending on polarity of sound pressure. In FIG. 6B, the case where the first plate 146 moves up is depicted. This upward movement of first plate 146 is coupled to a second plate 156 with perforations 166, which in turn results in increased gap between the first surface of the second plate 156 and the second electrode 176; hence the capacitance defined by these two surfaces decreases. An IC manufactured on the first substrate 116 is electrically connected to both of the electrodes 156 and 176; hence it is used to detect the change in capacitance, which is proportional to the acoustic pressure.

Figure 7:
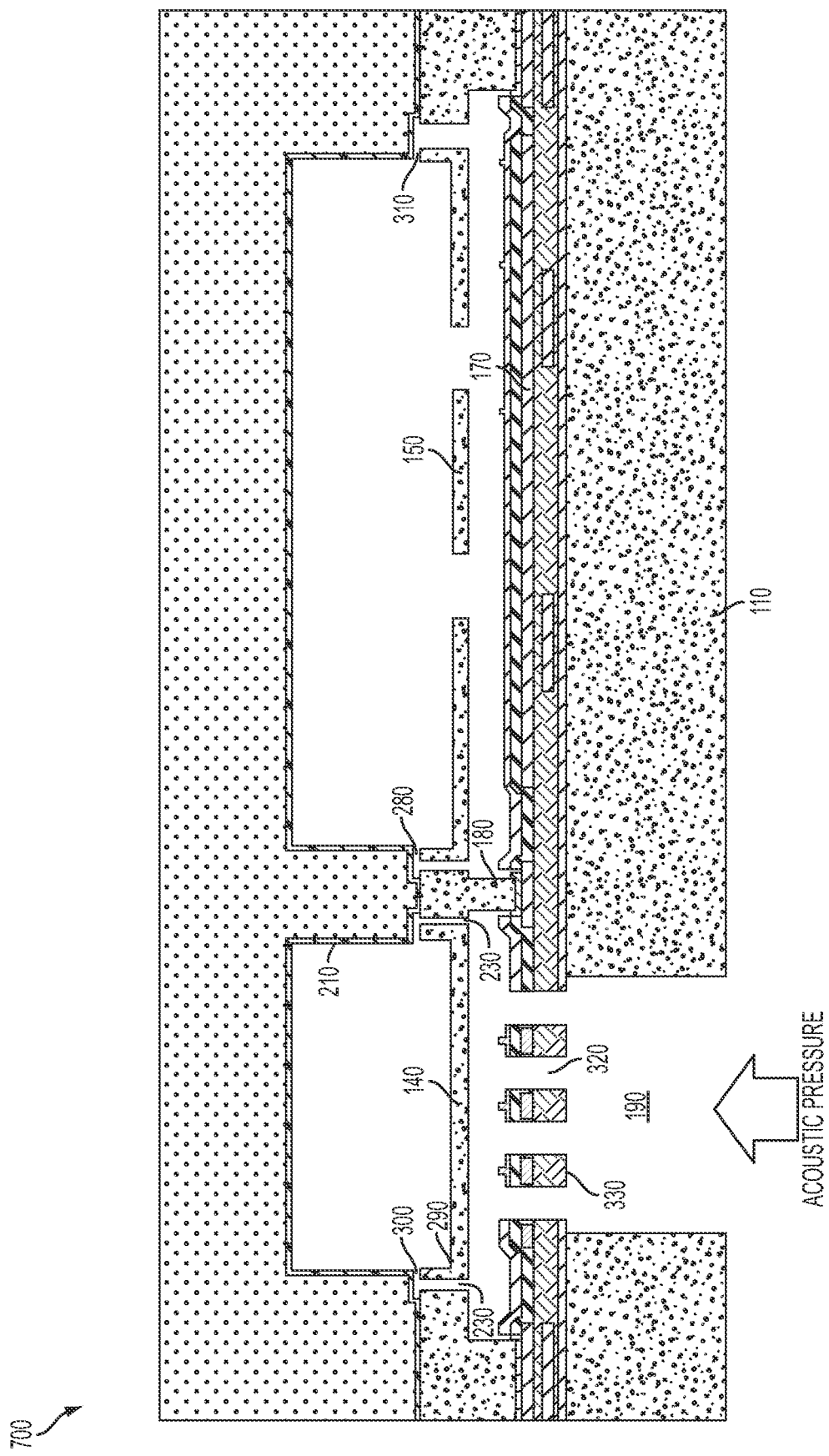
FIG. 7 shows alternative manufacturing options for a torsional microphone.

FIG. 7 shows alternative manufacturing options for a torsional microphone 700. In one alternative scheme, the posts 210 can be made wider to overlap over a PEC 230, while forming a shallow recess step to form a well-controlled and shallow extended PEC 280 for improving the low frequency response of the microphone. The depth of the channel is controllable as well as the length to provide a means to properly design a pressure equalization channel for proper frequency response. Similarly defining a partial overlap of the second substrate 120 over the outer periphery of the second plate 150 creates a bump stop 310 which limits out of plane, upward movement of the first and second plates 140 and 150. By proper design of the bump stop 310 the potential risk of the first plate 140 touching the first substrate 110 can be reduced significantly. Similarly, proper design of the length of an extended PEC 300 over outer edge (furthest away from the rotation axis) of the first plate will limit the rotational movement of the first and second plates 140 and 150 and may be used for significantly reducing the potential risk of first or second plates 140, 150 touching the first substrate 110. Limiting out of plane movement improves device reliability, especially against stiction, vibrations and shocks.

In another embodiment, the first and second plates 140 and 150 can be thinned down selectively so as to have a thicker portion and a thinner portion, creating a stepped device layer 290, for increasing resonant frequency of the device and reducing acoustic resistance of the perforations 160. In an embodiment, linkage 250 can have the same thickness as the thicker portion of first plate 140 or second plate 150. In another embodiment, linkage 250 can be same thickness as the thinner portion of first plate 140 or second plate 150. In another embodiment, linkage 250 can be of any thickness independent of the first and second plates. By proper design of the step profile of the first and second plates 140 and 150, first and second plates can be manufactured to be stiff enough to perform as microphone plates.

In another embodiment, back plate 330 with perforations 320 is provided to serve as a rigid electrode on the first substrate covering acoustic port 190, which faces the first surface side of the first plate 140. In an embodiment, the rigid back plate 330 can partially or completely cover the acoustic port 190. By proper design of a plate 330 with perforations 320, acoustic pressure input through acoustic port 190 will reach the first surface of the first plate 140 without noticeable attenuation, while the parallel plate capacitance formed by this backplate 330 and the first plate 140 will increase the electronic sense capacitance.

Under the influence of acoustic input, the capacitance between the backplate 330 and first plate 140 will change in the opposite phase to the capacitance formed between the second plate 150 and the second electrode 170. The phase difference between sense capacitances enables differential sensing. An additional benefit of the differential structure is the possibility of recovering from a stiction. In the event that either the first plate 140 or the second plate 150 comes into contact with the first substrate 110 and gets stuck, an electrical bias can be applied between the plate that is not in contact with the first substrate 110 and corresponding electrode (second electrode 170 or the backplate 330) for recovering from stiction. It is also possible to sense the tilting of plates and dynamically adjust bias applied across the plates to ensure that they do not come into contact with the first substrate 110.

Figure 8:
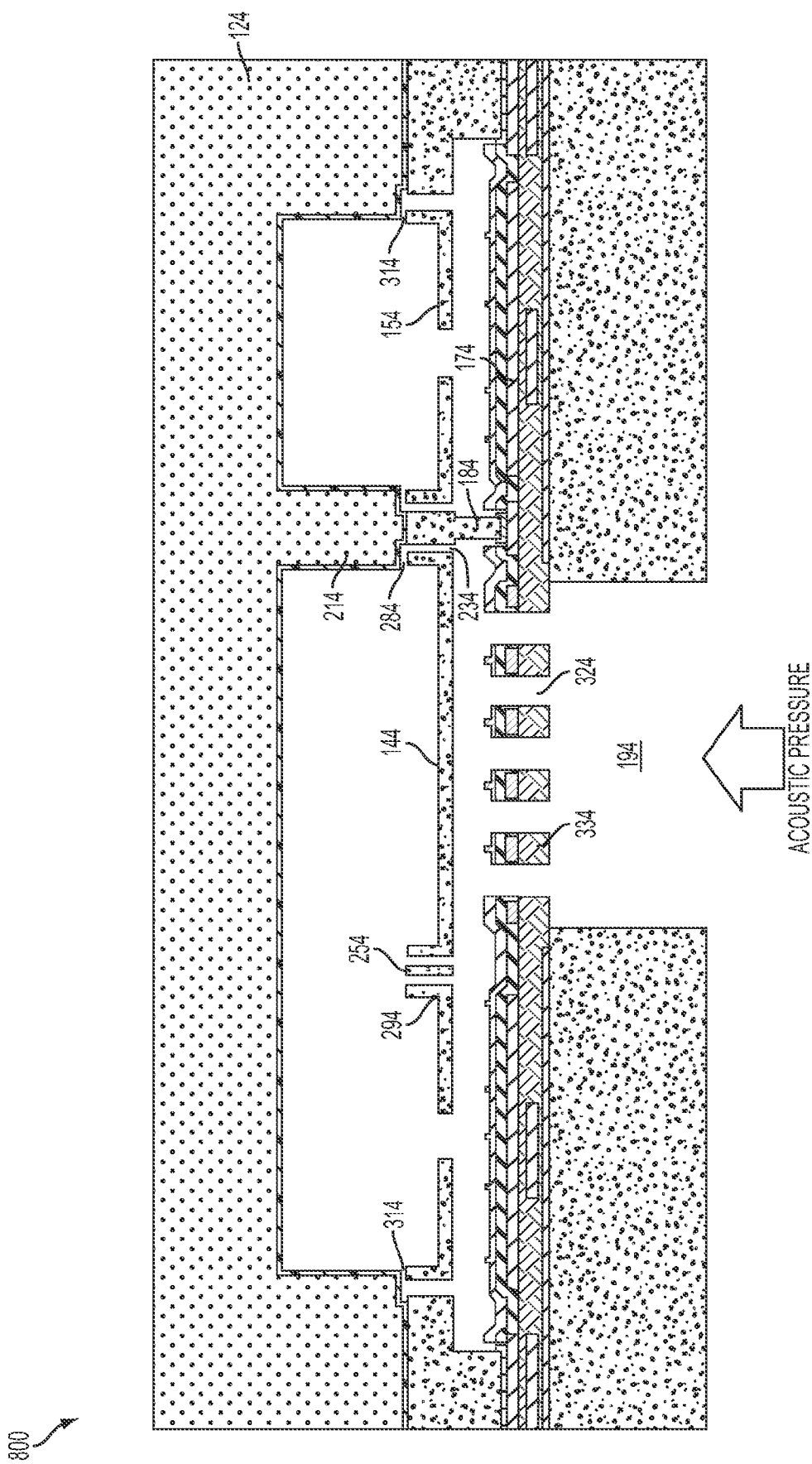
FIG. 8 shows alternative manufacturing options for a piston microphone.

FIG. 8 shows alternative manufacturing embodiment for the piston microphone. In one embodiment, the posts 214 can be made wider to overlap over a PEC 234, while forming a shallow recess step to form a well-controlled and shallow extended PEC 284, in order to improve low frequency response of the microphone. In a similar way, a partial overlap of bump stop 314 of the second substrate 124 over the outer periphery of the second plate 154 limits out of plane (upward) movement of the first and second plates 144, 154. Limiting of out of plane movement improves device reliability, especially to vibrations and shocks.

In another alternative scheme, the first and second plates 144, 154 can be thinned down selectively, creating a stepped device layer 294 to increase resonant frequency of the structure and to reduce acoustic resistance of perforations.

In another embodiment, backplate 334 with perforations 324 is provided to serve as an electrode on the first substrate covering acoustic port 194, which faces the first surface side of the first plate 144. In an embodiment, the rigid back plate 334 can partially or completely cover the acoustic port. By proper design of a plate 334 with perforations 324, acoustic input (sound pressure) through the opening (acoustic port 194) will reach the first surface of the first plate 144 without noticeable attenuation, while the parallel plate capacitance formed by this backplate 334 and the first plate 144 will increase the electronic sense capacitance.

Under the influence of acoustic input, this capacitance will change in the same phase as the capacitance formed between the second plate 154 and the second electrode 174. Hence the total sense capacitance will increase.

Figure 9A:
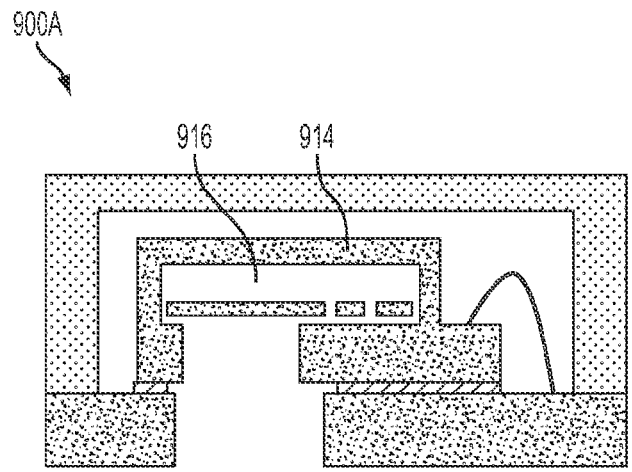
FIGS. 9A, 9B and 9C show packaging schemes for the current invention.
Figure 9B:
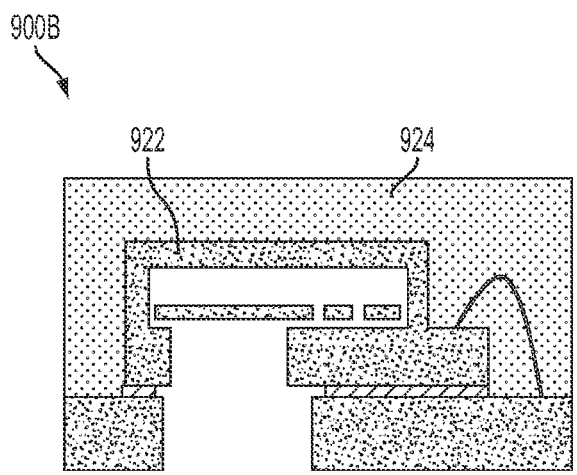
Figure 9C:
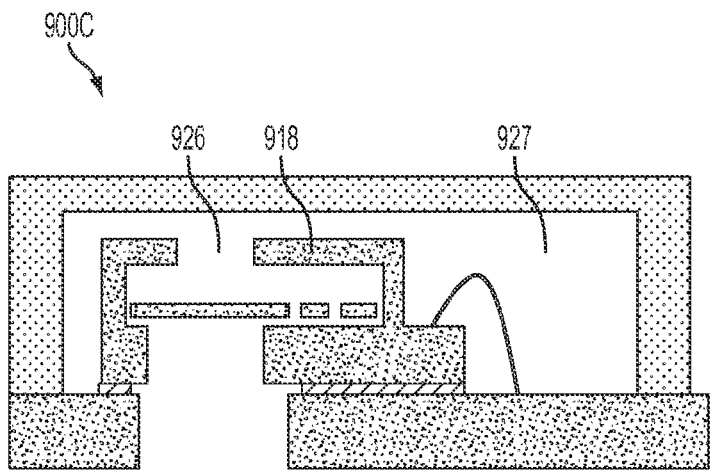

FIGS. 9A, 9B, and 9C show packaging schemes for that can be applied to any of the described embodiments of a microphone. FIG. 9A illustrates a capped package 900A with integrated device 914. Back cavity 916 is self-contained in the integrated device 914. FIG. 9B shows a molded package 900B where a plastic or similar encapsulating material 924 is molded or formed over the integrated device 922. FIG. 9C illustrates a capped package 900C that forms an extended back cavity 927 via an acoustic port 926 opened on top surface of integrated device 918.

Figure 10:
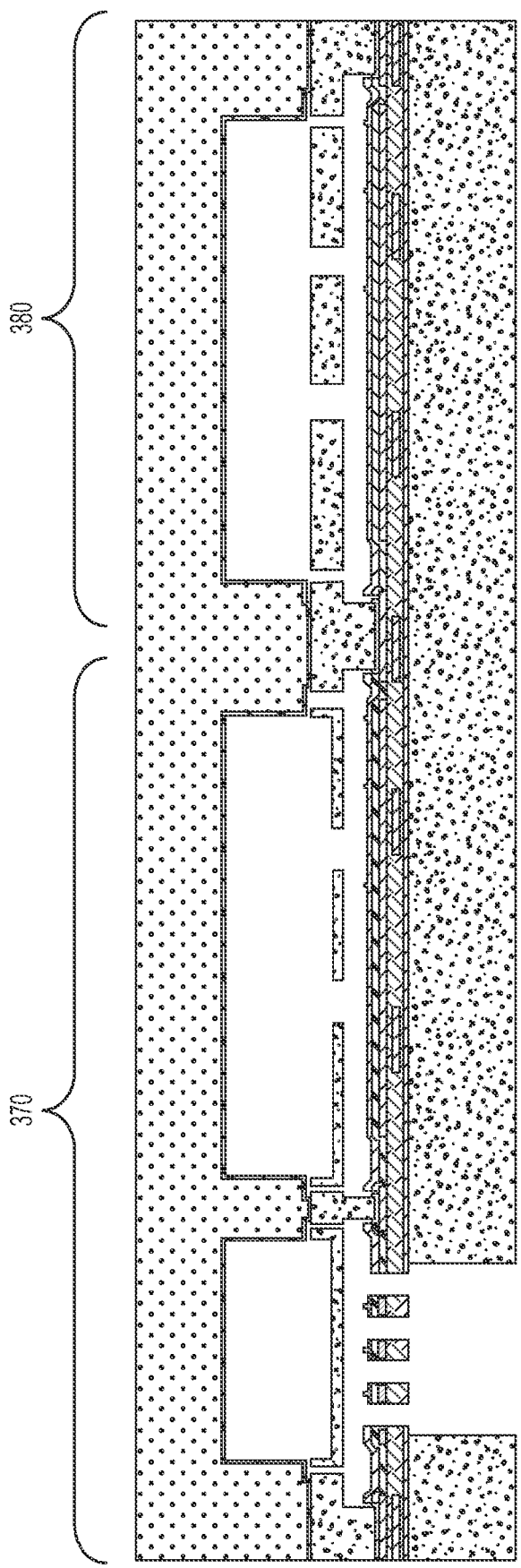
FIG. 10 shows an example of integration of MEMS microphone with other MEMS device.

FIG. 10 shows an embodiment which integrates a MEMS microphone 370 with one or more other MEMS devices 380 on the first and second substrates. Other MEMS devices include but are not limited to the gyroscope, accelerometer, pressure sensor and compass. MEMS microphone 370 can be a piston microphone or a torsional microphone as described in FIGS. 1, 2, 4, 5, 7, and 8.

Both torsional and piston designs of microphone provide improvements over conventional designs. The integrated back cavity where the enclosure is defined by the first and second substrates and integrated electronics from the CMOS-MEMS construction enables a significantly smaller package footprint than in conventional two-chip solutions. The integrated back cavity also relieves packaging considerations where the MEMS die and package together form the back cavity.

The torsional design inherently is expected to be less sensitive to accelerations during operation compared to similar dimensioned or larger microphones. Piston design, in terms of electronic pickup and movement of plates, is similar to existing MEMS and condenser microphones, but unlike the others is based on movement of solid plates, not diaphragms.

Also, unlike other designs, pressure sensing area and electrode area can be adjusted separately, giving extra flexibility on design at a cost of area/mass.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A MEMS device comprising;
   an anchor attached to a first substrate;
   a first plate with a first surface and a second surface;
   a second plate with a third surface and a fourth surface, attached to the first plate; and
   a linkage connecting the anchor to the first plate, where the first plate and second plate are displaced in the presence of an acoustic pressure differential between the first and second surfaces of the first plate;
   wherein the first plate, the second plate, the linkage, and the anchor are contained in an enclosure formed by the first substrate and a second substrate;
   wherein one of the first and second substrates contains an acoustic port to expose the first surface to the environment,
   wherein at least one electrode is formed on the first substrate.

2. The MEMS device of claim 1, where each of the first and second plates comprises of a material containing silicon.

3. The MEMS device of claim 1, wherein the second plate is perforated.

4. The MEMS device of claim 1, wherein the second plate moves in an opposite direction of the first plate.

5. The MEMS device of claim 4, wherein first and second plates are torque balanced around a rotational axis.

6. The MEMS device of claim 1, wherein the second plate moves in the same direction as the first plate.

7. The MEMS device of claim 1, where the MEMS device comprises a microphone.

8. The MEMS device of claim 1, where the enclosure forms an acoustic cavity.

9. The MEMS device of claim 1, further comprising in-plane bump stops to limit lateral movement of the first and second plates.

10. The MEMS device of claim 1, further comprising a capacitor, wherein a first electrode is formed by the second plate and a second electrode is formed by a conductive layer on the first substrate.

11. The MEMS device of claim 10, wherein the second electrode comprises of aluminum.

12. The MEMS device of claim 10, wherein the second electrode is connected to an integrated circuit on the first substrate.

13. The MEMS device of claim 1, further comprising a perforated plate disposed below the first plate and covering at least a portion of the acoustic port.

14. The MEMS device of claim 1, wherein a gap is defined by a standoff etched into the second substrate.

15. The MEMS device of claim 1, further comprising an additional insulating material disposed on the second electrode.

16. The MEMS device of claim 15, the additional insulating material is extended in select portions to form bump stops.

17. The MEMS device of claim 1, wherein at least one bump stops is formed from a receded post.

18. The MEMS device of claim 1, wherein the first and second plates have uniform thickness.

19. The MEMS device of claim 1, wherein the linkage has a thickness that is substantially the same as the thickness of the first plate or the second plate.

20. The MEMS device of claim 1, wherein the first plate has a thinner portion and a thicker portion.

21. The MEMS device of claim 20, wherein the linkage has a thickness equal to the thinnest portion of the first plate.

22. The MEMS device of claim 20, the linkage having a thickness greater than the thinnest portion of the first plate.

23. The MEMS device of claim 1, wherein an air flow path is provided from the first surface to the second surface.

\* \* \* \* \*